(12) United States Patent
Lee et al.

(10) Patent No.: US 9,721,886 B2
(45) Date of Patent: Aug. 1, 2017

(54) PRESERVATION OF FINE PITCH REDISTRIBUTION LINES

(71) Applicant: Intel Corporation, Santa Clara, CA (US)

(72) Inventors: Kevin J. Lee, Beaverton, OR (US); Hiten Kothari, Beaverton, OR (US); Wayne M. Lytle, Banks, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/778,667

(22) PCT Filed: Jun. 28, 2013

(86) PCT No.: PCT/US2013/048775
§ 371 (c)(1),
(2) Date: Sep. 21, 2015

(87) PCT Pub. No.: WO2015/195067
PCT Pub. Date: Dec. 23, 2015

(65) Prior Publication Data
US 2016/0181196 A1    Jun. 23, 2016

(51) Int. Cl.
*H01L 23/528* (2006.01)
*H01L 23/532* (2006.01)
*H01L 21/768* (2006.01)
*H01L 23/525* (2006.01)
*H01L 23/48* (2006.01)
(Continued)

(52) U.S. Cl.
CPC ...... *H01L 23/528* (2013.01); *H01L 21/76834* (2013.01); *H01L 21/76846* (2013.01);
(Continued)

(58) Field of Classification Search
CPC ............. H01L 23/528; H01L 23/53238; H01L 21/76846; H01L 21/76885; H01L 23/525;
(Continued)

(56) References Cited

U.S. PATENT DOCUMENTS 6,214,630 B1   4/2001  Hsuan et al.
2003/0024819 A1   2/2003  Lowe
(Continued)

FOREIGN PATENT DOCUMENTS

RU    2218680    10/2003

OTHER PUBLICATIONS

International Searching Authority, "Notification of Transmittal of the International Search Report and the Written Opinion of the International Searching Authority," mailed Feb. 23, 2016, in International application No. PCT/US2013/048775.
(Continued)

*Primary Examiner* — Caleen Sullivan
(74) *Attorney, Agent, or Firm* — Trop, Pruner & Hu, P.C.

(57) ABSTRACT

An embodiment includes a semiconductor apparatus comprising: a redistribution layer (RDL) including a patterned RDL line having two RDL sidewalls, the RDL comprising a material selected from the group comprising Cu and Au; protective sidewalls directly contacting the two RDL sidewalls; a seed layer including the material; and a barrier layer; wherein (a) the RDL line has a RDL line width orthogonal to and extending between the two RDL sidewalls, and (b) the seed and barrier layers each include a width parallel to and wider than the RDL line width. Other embodiments are described herein.

25 Claims, 5 Drawing Sheets

(52) U.S. Cl.
CPC ...... *H01L 21/76885* (2013.01); *H01L 23/525* (2013.01); *H01L 23/53238* (2013.01); *H01L 23/481* (2013.01); *H01L 2224/1182* (2013.01); *H01L 2224/13565* (2013.01)

(58) Field of Classification Search
CPC . H01L 29/00; H01L 21/76834; H01L 23/481; H01L 2224/18
USPC .......................................................... 257/737
See application file for complete search history.

(56) References Cited

U.S. PATENT DOCUMENTS

| | | |
|---|---|---|
| 2006/0192235 A1 | 8/2006 | Drewes et al. |
| 2007/0042553 A1 | 2/2007 | Kuesters et al. |
| 2010/0164109 A1 | 7/2010 | Chiou et al. |
| 2010/0171219 A1 | 7/2010 | Moreau et al. |
| 2011/0165776 A1 | 7/2011 | Hsu et al. |
| 2011/0260317 A1* | 10/2011 | Lu .......................... H01L 24/11 257/737 |
| 2011/0266667 A1* | 11/2011 | Wu ................... H01L 21/76852 257/737 |
| 2013/0140696 A1 | 6/2013 | Aoi |

OTHER PUBLICATIONS

Patent Office of the Russian Federation, Office Action mailed Jan. 17, 2017 in Russian Patent Application No. 2015151166.

* cited by examiner

PRESERVATION OF FINE PITCH REDISTRIBUTION LINES

TECHNICAL FIELD

An embodiment includes semiconductor processing and more specifically, preserving redistribution layers dimensions during processing of the same.

BACKGROUND

Through-silicon vias (TSV) associated with a die may not be aligned with contacts (e.g., bond pads) of the die. In such situations, an electrically conductive redistribution layer (RDL), such as a metal layer, may be patterned on the back side of the die or the device side of the die. The patterning may include photolithographic techniques where, for example, a copper material is deposited on a back side surface of a die. A mask is then used to define the RDL and etch a pattern such that the RDL has fingers/projections extending laterally from TSVs to a desired position for electrical contact with contact points (e.g., C4 bumps, contact pads) of the die or another die. An RDL may be connected to contact points of a die through, for example, solder connections.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

An embodiment includes fabricating protective sidewall(s) on edge(s) of very fine pitch thick metal RDL lines. The protective sidewalls, included in a sidewall film, protect the sides of the very fine pitch thick metal lines from chemical attack during the seed layer etch process step that occurs in a "semi-additive" process flow. Doing so eliminates or greatly reduces line width loss that occurs during seed layer etching due to the chemical attack. This greatly benefits very fine pitch redistribution line processing, where line width loss during the seed layer etch of about 0.5 um constitutes a large percentage of the overall line width when the redistribution lines are less than 4.0 um in width. Thus, an embodiment includes fabrication of a protective film on the sidewalls of very fine pitch metal lines, which prevents line width loss during the seed layer etch process.

Figure 1:
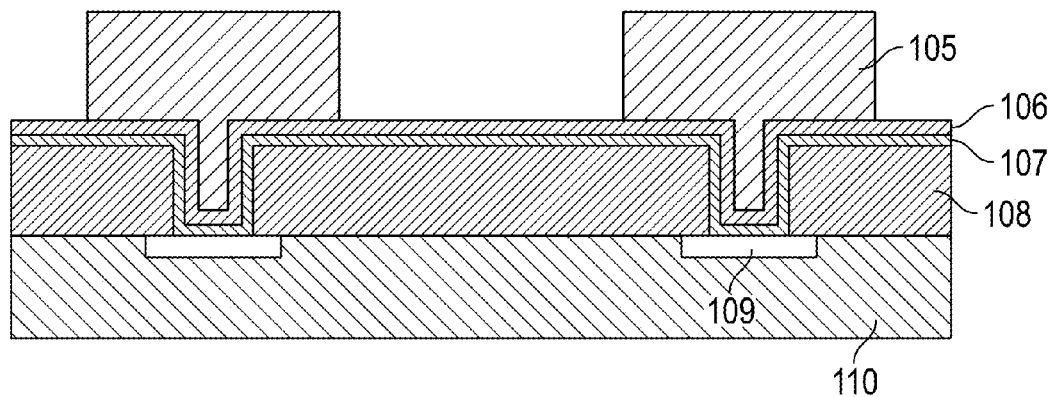
FIG. 1 includes a semiconductor device with a patterned RDL line.

FIG. 1 includes a semiconductor device with a patterned RDL line. Patterned copper (Cu) RDL layer forms RDL line 105. RDL line 105 is formed over RDL Cu seed layer 106, RDL barrier layer 107, passivation layer (e.g., nitride) 108, the last metal layer in a Damascene interconnect stack 109, and substrate 110. A barrier layer may line the portions of the device to prevent ion migration from metal lines during operation of the completed device. For example, the barrier layer may include tantalum (Ta) where the metal lines are to be of copper.

The device of FIG. 1 was formed via a "semi-additive" process. In a "semi-additive" process the unpatterned RDL has a thin seed layer (e.g., Cu). A reverse mask is then applied, which exposes parts of the RDL seed layer that will eventually become the RDL lines. Additional Cu is then added to the seed layer in the unmasked areas to form the RDL lines. The mask is stripped away and etching removes the now-exposed bare original seed Cu, isolating the individual RDL lines/traces.

In order to ensure adequate adhesion between various materials a seed layer may initially be deposited. The seed layer generally includes the same metal that is to form the metal lines. Alternatively, an alloy of the metal may be used to form the seed layer. The seed layer is generally quite thin. For example, the seed layer may be between about 10 angstroms and about 3,000 angstroms in thickness. By way of comparison, the complete metal lines to be formed may fill photoresist trenches (not shown and already removed by the point of the process shown in FIG. 1) and may be between about 0.5 microns and about 20 microns in height and may be between about 0.25 microns and about 7 microns in width. The seed layer may be deposited, for example, by atomic layer deposition (ALD) or physical vapor deposition (PVD). In this manner, thin and uniform seed layers are formed that adhere to silicon or other materials defining the trenches. Additionally, the seed layer may include material similar to that of the RDL lines. For example, the seed layer and the metal lines may both include copper. Therefore, the material to form the remainder of the metal lines adequately conforms with, and adheres to, the seed layer when deposited thereon. The seed layer thus acts as an adhesive interface between the materials of the substrate or barrier layer and the metal lines.

Figure 2:
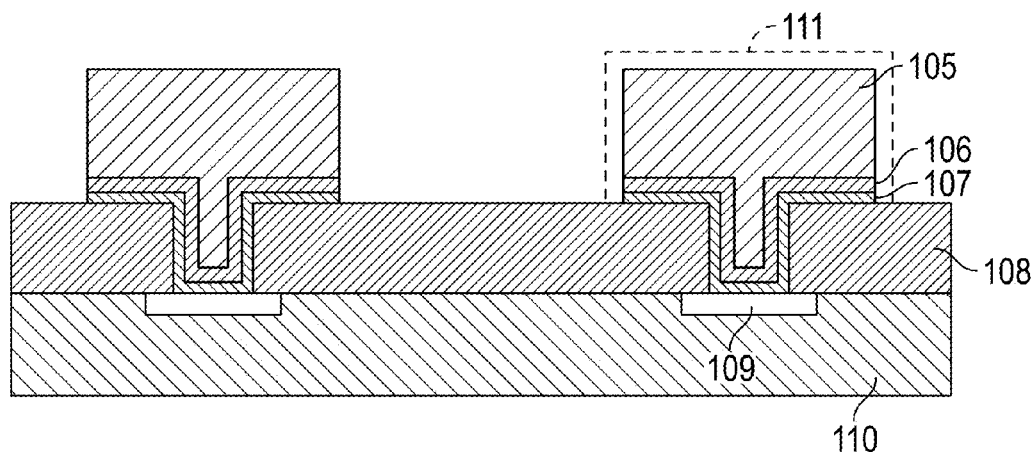
FIG. 2 includes a semiconductor device including a physically reduced version of the patterned RDL line of FIG. 1.

FIG. 2 includes a physically reduced version of the patterned RDL line of FIG. 1. Specifically, the device of FIG. 1 is processed with a copper seed layer 106 etch followed by a barrier layer 107 etch. During the copper seed layer etch step, both the height and width of the thick metal RDL lines decrease, as seen by dotted profile 111 that illustrates the original dimensions of one of the RDL lines.

Figure 3:
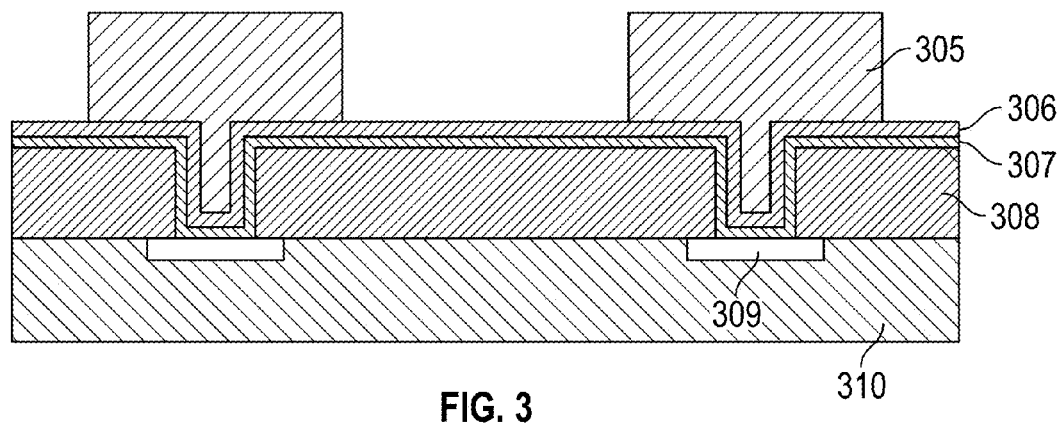
FIG. 3 includes a semiconductor device including a patterned RDL in an embodiment of the invention.

FIG. 3 includes a semiconductor device including a patterned RDL in an embodiment of the invention. As with FIG. 1, FIG. 3 includes a semiconductor device with a patterned RDL line. Patterned Cu RDL layer forms RDL line 305. RDL line 305 is formed over RDL Cu seed layer 306, RDL barrier layer 307, passivation layer (e.g., nitride) 308, the last metal layer in a Damascene interconnect stack 309, and substrate 310. The device of FIG. 3 was formed via a "semi-additive" process.

Figure 4:
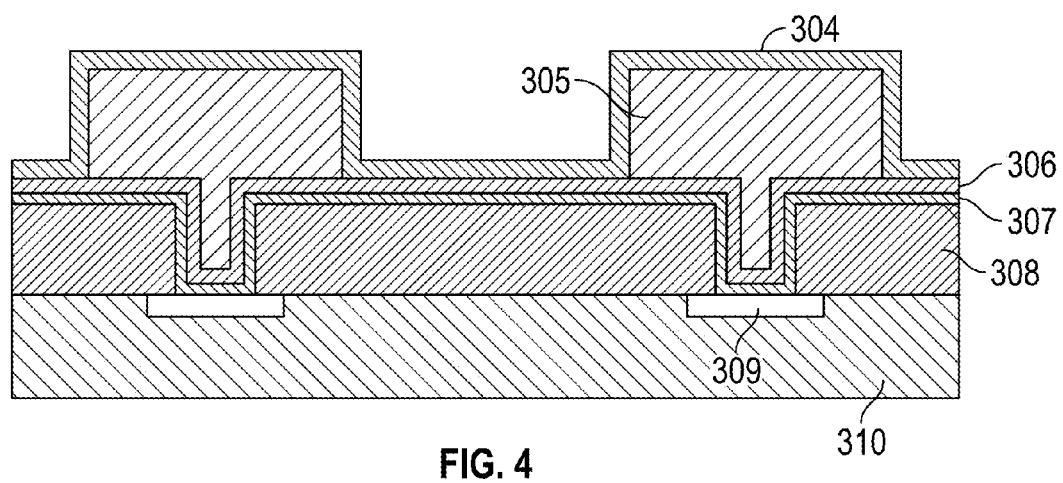
FIG. 4 includes a semiconductor device including a patterned RDL after RDL sidewall protection layer deposition in an embodiment of the invention.
Figure 8:
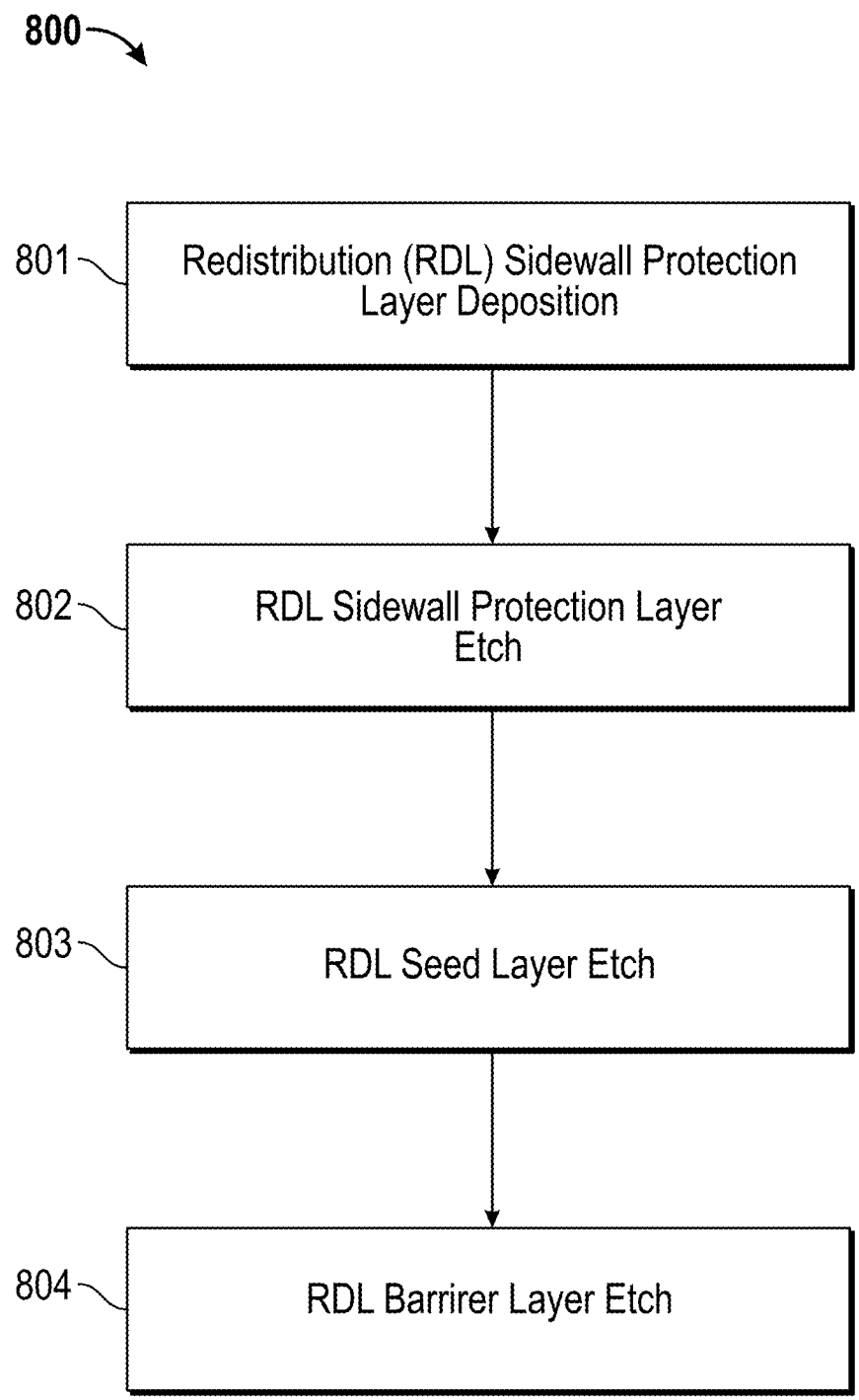
FIG. 8 includes a semiconductor device processing method in an embodiment of the invention.

FIG. 4 includes a semiconductor device including a patterned RDL after RDL sidewall protection layer deposition (see also block 801 of method 800 in FIG. 8). For example, an embodiment of the method starts with a wafer that has been processed to the point where the patterned copper thick metal redistribution lines are formed but the copper seed layer etch has not been done yet. Then, as seen in FIG. 4, a sidewall protection film 304 is deposited on top the entire wafer surface. In an embodiment the film includes silicon nitride, but other materials such as silicon carbide, silicon oxide, silicon oxynitride, and various polymers are also suitable and included in various other embodiments.

Figure 5:
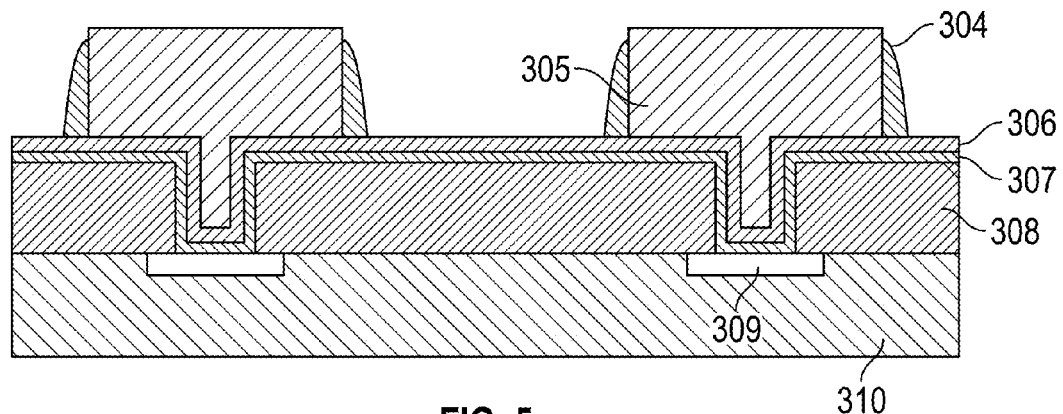
FIG. 5 includes a semiconductor device including a patterned RDL after RDL sidewall protection layer etching in an embodiment of the invention.

FIG. 5 includes a semiconductor device including a patterned RDL after RDL sidewall protection layer etching in an embodiment of the invention (see also block 802 in FIG. 8). For example, an anisotropic plasma etch process is used to remove sidewall protection film 304 from horizontal surfaces while leaving vertical surfaces of RDL line 305 covered. In this way copper seed layer 306 in between the copper thick metal RDL lines (only one of which is enumerated as line 305) become exposed while the sidewalls of the thick metal RDL lines remain covered.

Figure 6:
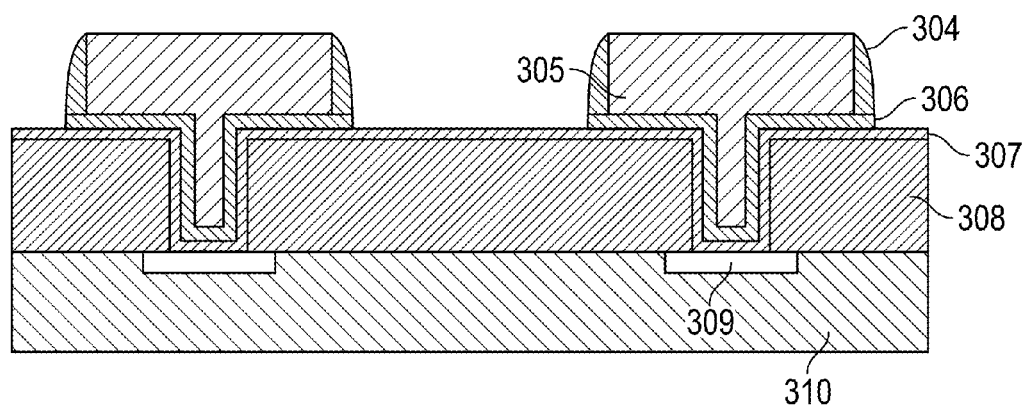
FIG. 6 includes a semiconductor device including a patterned RDL after seed layer etching in an embodiment of the invention.

FIG. 6 includes a semiconductor device including a patterned RDL after seed layer etching in an embodiment of the invention (see also block 803 in FIG. 8). For example, an isotropic wet etch process is used to etch away copper seed layer 306 in between copper thick metal RDL lines. Since the RDL lines are covered with sidewall protection film 304, no (or very little) etching of the RDL sidewalls occurs and hence there is little to no line width loss during the copper seed etch process of FIG. 6. Suitable copper wet etchants include, for example, ferric chloride-based etchants and sulfuric acid/hydrogen peroxide mixtures.

Figure 7:
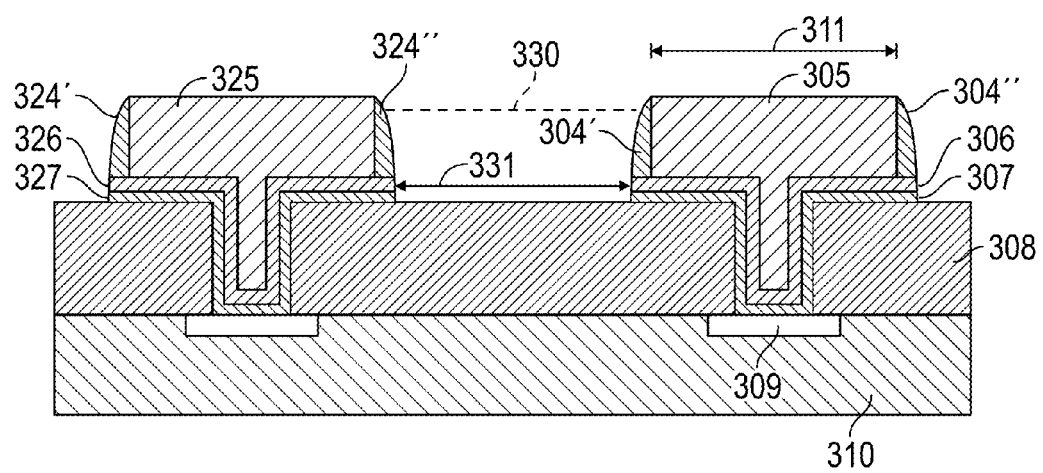
FIG. 7 includes a semiconductor device including a patterned RDL after barrier layer etching in an embodiment of the invention.

FIG. 7 includes a semiconductor device including a patterned RDL after barrier layer etching in an embodiment of the invention (see also block 804 in FIG. 8). For example, barrier layer film 307 is etched using a wet chemical or a plasma etch process. In embodiment barrier film 307 includes titanium (Ti), but other suitable barrier films in other embodiments include tantalum (Ta), chromium (Cr), and the like. FIG. 7 shows a structure where a protective sidewall film 304 is located on the sides of the fine pitch thick metal RDL lines 305 to protect the sidewalls from chemical attack during copper seed layer etch processing.

RDL line 305 has a RDL line width 311 orthogonal to and extending between RDL sidewalls 304', 304". Seed layer 306 and barrier layer 307 each include a width parallel to and wider than the RDL line width 311. Seed layer 306 includes edges vertically aligned with the lower most edges of protective sidewalls 304', 304". Barrier layer 307 includes an edge vertically aligned with edges of seed layer 306 and with the lower most edges of protective sidewalls 304', 304".

In FIG. 7 additional patterned RDL line 325, included in the same RDL as RDL line 305, has additional RDL sidewalls and additional protective sidewalls 324', 324" directly contacting the additional RDL sidewalls. Further, additional seed layer 326 including the same material as RDL line 325 and is coplanar with seed layer 306. Further, an additional barrier layer 327 is coplanar with barrier layer 307. The additional RDL line has an additional RDL line width and the additional seed and barrier layers each include a width parallel to and wider than the additional RDL line width. For example, the seed and barrier layers 326, 327 may extend to the outer edges of protective sidewalls 324', 324".

In an embodiment no dielectric material and no other patterned RDL line exists between the illustrated portions of RDL lines 305, 325. This may be in contrast with dual damascene processes. Thus, there may be an empty void 331 between lines 305, 325. Void 331 is intersected by axis 330 which connect (for illustration purposes) RDL lines 305, 325. In an embodiment, void 330 includes no dielectric material. Thus, RDL lines 305, 325 may form an outer exterior or perimeter for the device without including any dielectric planarized even with tops of the lines.

As shown in FIG. 7, seed layers 306, 326 do not directly contact each other and barrier layers 307, 327 do not directly contact each other. In an embodiment, RDL line width 311 is less than 5 microns, but in other embodiments it is less than 7, 6, 4, 3, or 2 microns.

At times herein an RDL line may be referred to as an RDL layer. However, doing so merely connotes that many of the RDL lines are formed from a single layer. The RDL layer, after it has been patterned, may include many RDL lines.

An embodiment, such as the embodiment of FIG. 7, enables low cost fabrication of very fine pitch thick metal lines at pitches below 4 um lines/space (L/S). This provides advantages over damascene-type process flows, which may require copper and barrier layer chemical mechanical polishing/planarization (CMP) steps that are considerably more expensive compared to "semi-additive" processes described herein.

Figure 9:
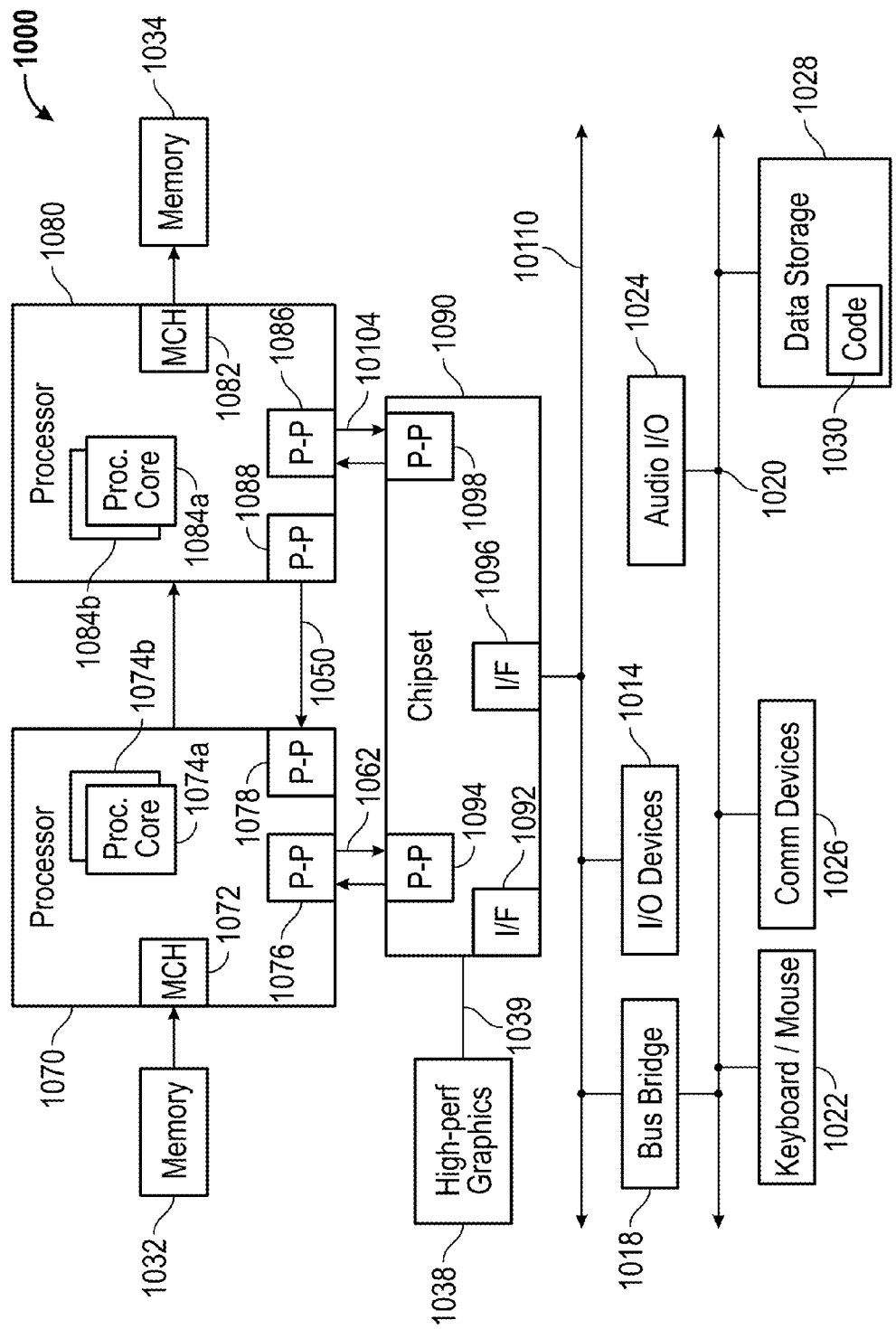
FIG. 9 includes a system for use with an embodiment of the invention.

Referring now to FIG. 9, shown is a block diagram of a system embodiment 1000 in accordance with an embodiment of the present invention. Shown is a multiprocessor system 1000 that includes a first processing element 1070 and a second processing element 1080. While two processing elements 1070 and 1080 are shown, it is to be understood that an embodiment of system 1000 may also include only one such processing element. System 1000 is illustrated as a point-to-point interconnect system, wherein the first processing element 1070 and second processing element 1080 are coupled via a point-to-point interconnect 1050. It should be understood that any or all of the interconnects illustrated may be implemented as a multi-drop bus rather than point-to-point interconnect. As shown, each of processing elements 1070 and 1080 may be multicore processors, including first and second processor cores (i.e., processor cores 1074a and 1074b and processor cores 1084a and 1084b). Such cores 1074, 1074b, 1084a, 1084b may be configured to execute instruction code in a manner similar to methods discussed herein.

Each processing element 1070, 1080 may include at least one shared cache. The shared cache may store data (e.g., instructions) that are utilized by one or more components of the processor, such as the cores 1074a, 1074b and 1084a, 1084b, respectively. For example, the shared cache may locally cache data stored in a memory 1032, 1034 for faster access by components of the processor. In one or more embodiments, the shared cache may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the present invention is not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, microarchitectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

First processing element 1070 may further include memory controller logic (MC) 1072 and point-to-point (P-P) interfaces 1076 and 1078. Similarly, second processing element 1080 may include a MC 1082 and P-P interfaces 1086 and 1088. MC's 1072 and 1082 couple the processors to respective memories, namely a memory 1032 and a memory 1034, which may be portions of main memory locally attached to the respective processors. While MC logic 1072 and 1082 is illustrated as integrated into the processing elements 1070, 1080, for alternative embodiments the MC logic may be discrete logic outside the processing elements 1070, 1080 rather than integrated therein.

First processing element 1070 and second processing element 1080 may be coupled to an I/O subsystem 1090 via P-P interfaces 1076, 1086 via P-P interconnects 1062, 10104, respectively. As shown, I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, a bus may be used to couple graphics engine 1038 to I/O subsystem 1090. Alternately, a point-to-point interconnect 1039 may couple these components.

In turn, I/O subsystem 1090 may be coupled to a first bus 10110 via an interface 1096. In one embodiment, first bus 10110 may be a Peripheral Component Interconnect (PCI) bus, or a bus such as a PCI Express bus or another third generation I/O interconnect bus, although the scope of the present invention is not so limited.

As shown, various I/O devices 1014, 1024 may be coupled to first bus 10110, along with a bus bridge 1018 which may couple first bus 10110 to a second bus 1020. In one embodiment, second bus 1020 may be a low pin count (LPC) bus. Various devices may be coupled to second bus 1020 including, for example, a keyboard/mouse 1022, communication device(s) 1026 (which may in turn be in communication with a computer network), and a data storage unit 1028 such as a disk drive or other mass storage device which may include code 1030, in one embodiment. The code 1030 may include instructions for performing embodiments of one or more of the methods described above. Further, an audio I/O 1024 may be coupled to second bus 1020.

Various components of system 1000, such as components 1070, 1080, 1032, 1034, 1038, 1090, may include the RDL lines described herein.

Note that other embodiments are contemplated. For example, instead of the point-to-point architecture shown, a system may implement a multi-drop bus or another such communication topology. Also, the elements of the Figure may alternatively be partitioned using more or fewer integrated chips than shown in the Figure.

Example 1 includes a semiconductor apparatus comprising: a redistribution layer (RDL) including a patterned RDL line having two RDL sidewalls, the RDL comprising a material; protective sidewalls directly contacting the two RDL sidewalls; a seed layer including the material; and a barrier layer; wherein (a) the RDL line has a RDL line width orthogonal to and extending between the two RDL sidewalls, and (b) the seed and barrier layers each include a width parallel to and wider than the RDL line width.

In an embodiment the material is selected from the group comprising Cu and Au. While some embodiments include Cu or Au for the RDL lines, other embodiments are not so limited and may include other metals and/or alloys not specifically mentioned. In an embodiment the sidewalls are vertical and orthogonal to the horizontal plane in which the substrate lies. The protective sidewalls may "directly contact" the two RDL sidewalls, despite there being some level of oxidation or contamination of the RDL sidewalls at the time of forming the protective sidewalls. This is true for other areas herein that refer to "direct contact". Further, the seed layer may include the same material as the RDL line despite doing so in a different manner than the RDL line (e.g., the seed layer may be an alloy of the material used for the RDL line and vice versa, the seed layer may include different proportions of materials (albeit the same materials) as the RDL line, and the like). In an embodiment the RDL line includes a landing pad. The entire RDL line may constitute a landing pad (e.g., for a short RDL line) or just a portion of the RDL line may constitute a landing pad (e.g., for a long RDL line).

In example 2 the subject matter of the Example 1 can optionally include, wherein the seed layer includes an edge vertically aligned with an edge of one of the protective sidewalls.

In example 3 the subject matter of the Examples 1-2 can optionally include wherein the barrier layer includes an edge vertically aligned with the edge of the seed layer.

In example 4 the subject matter of the Examples 1-3 can optionally include wherein the RDL couples to a through silicon via (TSV).

In example 5 the subject matter of the Examples 1-4 can optionally include an additional patterned RDL line, included in the RDL, having two additional RDL sidewalls, additional protective sidewalls directly contacting the two additional RDL sidewalls; an additional seed layer including the material and coplanar with the seed layer; an additional barrier layer coplanar with the barrier layer; wherein (a) the additional RDL has an additional RDL line width orthogonal to and extending between the two additional RDL sidewalls, and (b) the additional seed and barrier layers each include a width parallel to and wider than the additional RDL line width.

In example 6 the subject matter of the Examples 1-5 can optionally include wherein no dielectric material and no other patterned RDL line exists between a portion of the patterned RDL line and an additional portion of the additional patterned RDL line.

In example 7 the subject matter of the Examples 1-6 can optionally include, wherein seed layer does not directly contact the additional seed layer.

In example 8 the subject matter of the Examples 1-7 can optionally include, wherein barrier layer does not directly contact the additional barrier layer.

In example 9 the subject matter of the Examples 1-8 can optionally include an empty void between the patterned RDL line and the additional patterned RDL line, wherein the empty void is intersected by an axis connecting the patterned RDL line and the additional patterned RDL line.

In example 10 the subject matter of the Examples 1-9 can optionally include, wherein the empty void includes no dielectric material.

In example 11 the subject matter of the Examples 1-10 can optionally include, wherein the RDL line width is less than 5 microns.

In example 12 the subject matter of the Examples 1-11 can optionally include, wherein the barrier layer includes at least one material selected from the group comprising Ti, Ta, and Cr and the protective sidewalls include at least one material selected from the group comprising silicon nitride, silicon carbide, silicon oxide, and silicon oxynitride.

In example 13 the subject matter of the Examples 1-12 can optionally include, wherein the barrier layer does not directly contact the two RDL sidewalls.

In example 14 the subject matter of the Examples 1-13 can optionally include, wherein the seed layer directly contacts the barrier layer, the protective sidewalls, and the patterned RDL line.

In example 15 the subject matter of the Examples 1-14 can optionally include, wherein the protective sidewalls do not directly contact uppermost portions of the two RDL sidewalls.

Thus, FIG. 5 shows sidewalls not directly contact uppermost portions of the two RDL sidewalls, however in an embodiment this lack of contact is resolved during the seed layer etch (which also etches the RDL line) (see FIG. 6). However, in other embodiments this gap between the top of the protective sidewalls and the top of the RDL line sidewalls remains.

Example 16 includes a semiconductor apparatus comprising: a redistribution (RDL) line having RDL sidewalls; protective sidewalls directly contacting the RDL sidewalls; a seed layer including the material and directly contacting the RDL line; wherein (a) the RDL line has a RDL line width extending between the RDL sidewalls, and (b) the seed layer includes a width wider than the RDL line width.

Thus, some embodiments may include a barrier layer but such a layer is not absolutely required in all embodiments.

In example 17 the subject matter of the Example 16 can optionally include wherein the seed layer includes an edge vertically aligned with an edge of one of the protective sidewalls.

In example 18 the subject matter of the Examples 16-17 can optionally include an additional RDL line directly contacting an additional seed layer coplanar with the seed layer; wherein seed layer does not directly contact the additional seed layer.

In example 19 the subject matter of the Examples 16-18 can optionally include an empty void intersected by an axis connecting the RDL line and the additional RDL line.

In example 20 the subject matter of the Examples 16-19 can optionally include wherein the RDL line width is less than 5 microns.

Example 21 includes a semiconductor processing method comprising: forming a redistribution (RDL) line having RDL sidewalls; forming protective sidewalls directly contacting the RDL sidewalls; forming a seed layer including the material and directly contacting the RDL line; wherein (a) the RDL line has a RDL line width extending between the RDL sidewalls, and (b) the seed layer includes a width wider than the RDL line width.

In example 22 the subject matter of the Example 21 can optionally include forming an edge of the seed layer that is vertically aligned with an edge of one of the protective sidewalls.

In example 23 the subject matter of the Examples 21-22 can optionally include forming an additional RDL line directly contacting an additional seed layer coplanar with the seed layer; wherein seed layer does not directly contact the additional seed layer; and forming an empty void intersected by an axis connecting the RDL line and the additional RDL line.

In example 24 the subject matter of the Examples 21-23 can optionally include wherein the RDL line width is less than 5 microns.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor apparatus comprising:
a redistribution layer (RDL) including a patterned RDL line having two RDL sidewalls, the RDL comprising a material;
protective sidewalls directly contacting the two RDL sidewalls;
a seed layer including the material; and
a barrier layer;
an additional patterned RDL line, included in the RDL, having two additional RDL sidewalls;
additional protective sidewalls directly contacting the two additional RDL sidewalls;
an additional seed layer including the material and coplanar with the seed layer; and
an additional barrier layer coplanar with the barrier layer;
wherein (a) the RDL line has a RDL line width orthogonal to and extending between the two RDL sidewalls, and (b) the seed and barrier layers each include a width parallel to and wider than the RDL line width;
wherein (a) the additional RDL has an additional RDL line width orthogonal to and extending between the two additional RDL sidewalls, and (b) the additional seed and barrier layers each include a width parallel to and wider than the additional RDL line width.

2. The apparatus of claim 1, wherein the seed layer includes an edge vertically aligned with an edge of one of the protective sidewalls.

3. The apparatus of claim 2, wherein the barrier layer includes an edge vertically aligned with the edge of the seed layer.

4. The apparatus of claim 1, wherein the RDL couples to a through silicon via (TSV).

5. The apparatus of claim 1, wherein no dielectric material and no other patterned RDL line exists between a portion of the RDL line and an additional portion of the additional RDL line.

6. The apparatus of claim 1, wherein the seed layer does not directly contact the additional seed layer and the barrier layer does not directly contact the additional barrier layer.

7. The apparatus of claim 6 comprising an empty void between the RDL line and the additional RDL line, wherein the empty void is intersected by an axis connecting the RDL line and the additional RDL line.

8. The apparatus of claim 7, wherein the empty void includes no dielectric material.

9. The apparatus of claim 1, wherein the material is selected from the group comprising Cu and Au.

10. The apparatus of claim 1, wherein the RDL line width is less than 5 microns.

11. The apparatus of claim 10, wherein the barrier layer includes at least one material selected from the group comprising Ti, Ta, and Cr and the protective sidewalls include at least one material selected from the group comprising silicon nitride, silicon carbide, silicon oxide, and silicon oxynitride.

12. The apparatus of claim 1, wherein the barrier layer does not directly contact the two RDL sidewalls.

13. The apparatus of claim 12, wherein the seed layer directly contacts the barrier layer, the protective sidewalls, and the RDL line.

14. The apparatus of claim 1, wherein the protective sidewalls do not directly contact uppermost portions of the two RDL sidewalls.

15. A semiconductor apparatus comprising:
a redistribution layer (RDL) line having RDL sidewalls;
protective sidewalls directly contacting the RDL sidewalls; and
a seed layer directly contacting the RDL line;
an additional RDL line directly contacting an additional seed layer that is coplanar with the seed layer;
wherein (a) the RDL line has a RDL line width extending between the RDL sidewalls, (b) the seed layer includes a width wider than the RDL line width; and (c) the seed layer does not directly contact the additional seed layer.

16. The apparatus of claim 15, wherein the seed layer includes an edge vertically aligned with an edge of one of the protective sidewalls.

17. The apparatus of claim 15 comprising an empty void intersected by an axis connecting the RDL line and the additional RDL line.

18. The apparatus of claim 15, wherein the RDL line width is less than 5 microns.

19. The apparatus of claim 15, wherein the RDL couples to a through silicon via (TSV).

20. A semiconductor apparatus comprising:
a redistribution layer (RDL) line having RDL sidewalls;
protective sidewalls directly contacting the RDL sidewalls; and
a seed layer directly contacting the RDL line;
wherein (a) the RDL line has a RDL line width, extending between the RDL sidewalls, which is less than 5 microns, and (b) the seed layer includes a width wider than the RDL line.

21. The apparatus of claim 20 comprising:
an additional RDL line directly contacting an additional seed layer coplanar with the seed layer;
an empty void intersected by an axis connecting the RDL line and the additional RDL line;
wherein the seed layer does not directly contact the additional seed layer.

22. The apparatus of claim 20, wherein the RDL couples to a through silicon via (TSV).

23. A semiconductor apparatus comprising:
a redistribution layer (RDL) including a patterned RDL line having two RDL sidewalls, the RDL comprising a material;
protective sidewalls directly contacting the two RDL sidewalls;
a seed layer including the material; and
a barrier layer;
wherein (a) the RDL line has a RDL line width orthogonal to and extending between the two RDL sidewalls, (b) the seed and barrier layers each include a width parallel to and wider than the RDL line width, and (c) the RDL couples to a through silicon via (TSV).

24. The apparatus of claim 23, wherein the protective sidewalls include at least one material selected from the group comprising silicon nitride, silicon carbide, silicon oxide, and silicon oxynitride.

25. The apparatus of claim 23, wherein the protective sidewalls do not directly contact uppermost portions of the two RDL sidewalls.

* * * * *